(12) United States Patent
Orschel et al.

(10) Patent No.: US 10,361,106 B2
(45) Date of Patent: *Jul. 23, 2019

(54) METHODS AND SYSTEMS FOR PREVENTING UNSAFE OPERATIONS

(71) Applicant: GlobalWafers Co., Ltd., Hsinchu (TW)

(72) Inventors: Benno Orschel, St. Louis, MO (US); Mike Wolfram, Dachwig (DE)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/029,212

(22) Filed: Jul. 6, 2018

(65) Prior Publication Data

US 2018/0315631 A1 Nov. 1, 2018

Related U.S. Application Data

(63) Continuation of application No. 14/142,533, filed on Dec. 27, 2013, now Pat. No. 10,032,659.

(Continued)

(51) Int. Cl.
*H01J 37/32* (2006.01)
*H05H 1/46* (2006.01)
(Continued)

(52) U.S. Cl.
CPC ...... *H01L 21/67288* (2013.01); *G05B 19/406* (2013.01); *G05B 2219/35283* (2013.01);
(Continued)

(58) Field of Classification Search
CPC ........ G05B 19/406; Y02P 90/18; Y02P 90/04; Y02P 90/10; Y10S 901/01; Y10S 901/47;
(Continued)

(56) References Cited

U.S. PATENT DOCUMENTS 6,076,652 A 6/2000 Head
6,144,301 A 11/2000 Frieden
(Continued)

OTHER PUBLICATIONS

Cao et al., Ga based approach for optimized scheduling in a semiconductor wafer fabrication, 4 pages (Year: 2009).*
(Continued)

*Primary Examiner* — Thuy Dao
(74) *Attorney, Agent, or Firm* — Armstrong Teasdale LLP (57) ABSTRACT

A system for preventing an unsafe operation of a plurality of semiconductor wafer manufacturing machines communicatively coupled to a computing device. The system includes the computing device, which includes a processor coupled to a memory. The memory contains processor-executable instructions that, when executed, cause the computing device to perform the steps of storing, in the memory, a first state of a first machine of the plurality of machines, generating a first pending output to be issued to the first machine, determining whether an unsafe condition would result if the first pending output is issued to the first machine in the first state, issuing the first pending output upon determining that issuing the first pending output would not result in an unsafe condition, and blocking the first pending output from being issued upon determining that issuing the first pending output would result in an unsafe condition.

17 Claims, 9 Drawing Sheets

Related U.S. Application Data (60) Provisional application No. 61/747,049, filed on Dec. 28, 2012.

(51) Int. Cl.
  *H01L 21/02* (2006.01)
  *H01L 21/67* (2006.01)
  *G05B 19/406* (2006.01)

(52) U.S. Cl.
  CPC .............. *G05B 2219/45031* (2013.01); *G05B 2219/50193* (2013.01)

(58) Field of Classification Search
  CPC ... H03H 7/40; H03H 7/38; H02J 50/12; H02J 50/60; H02J 50/70; H02J 50/80; H01L 21/6728; H01J 37/32183; A61B 3/16; G06F 19/321; G06F 21/53; G06F 21/566; G06Q 50/22; G06Q 50/24; G06Q 10/06398; H04L 41/08; H04L 67/06; H04L 67/42
  See application file for complete search history.

(56) References Cited

U.S. PATENT DOCUMENTS

| | | | |
|---|---|---|---|
| 6,574,613 | B1 | 6/2003 | Moreno-Barragan |
| 7,746,285 | B2 | 6/2010 | Forster |
| 7,937,277 | B2 * | 5/2011 | Marx .................... G06F 19/321 705/2 |
| 9,082,589 | B2 * | 7/2015 | Thomas ................ H01J 37/321 |
| 2002/0104476 | A1 | 8/2002 | Ferguson |
| 2003/0182031 | A1 | 9/2003 | Gibbs et al. |
| 2004/0107021 | A1 * | 6/2004 | Jevtic ............... G05B 19/41865 700/228 |
| 2004/0201647 | A1 | 10/2004 | Jackson et al. |
| 2005/0063114 | A1 | 3/2005 | Suhara et al. |
| 2007/0107057 | A1 * | 5/2007 | Chander ................. G06F 21/54 726/22 |
| 2007/0180439 | A1 * | 8/2007 | Sundararajan ...... G06F 11/3644 717/158 |
| 2007/0205881 | A1 | 9/2007 | Breed |
| 2008/0047023 | A1 * | 2/2008 | Lam ........................ G06F 21/52 726/30 |
| 2010/0138026 | A1 | 6/2010 | Kaushal et al. |
| 2015/0264074 | A1 * | 9/2015 | Mendelev ........... G06F 11/3672 726/25 |

OTHER PUBLICATIONS

Rae, Andrew, "Helping the Operator in the Loop: Practical Human Machine Interface Principles for Safe Computer Controlled Systems", CRPTI, Proc. 12th Australian Conference on Safety-Related programmable Systems, 2007, vol. 86, pp. 1-10.

Kadav, Asim et al., "Tolerating Hardware Device Failures in Software", Oct. 2009, pp. 1-13.

* cited by examiner

METHODS AND SYSTEMS FOR PREVENTING UNSAFE OPERATIONS

CROSS-REFERENCE TO RELATED APPLICATIONS

This application is a continuation of and claims the benefit of U.S. patent application Ser. No. 14/142,533, filed Dec. 27, 2013, which claims the benefit of priority to U.S. Provisional Patent Application No. 61/747,049, filed Dec. 28, 2012, the entire disclosures of which are incorporated herein by reference.

BACKGROUND OF THE INVENTION

The field of the invention relates generally to computerized control of machines, and more particularly to preventing instructions for unsafe operations from being issued to machines.

Complex machines, such as those found in a silicon wafer manufacturing plant or other industrial plant, often include multiple components whose operations must be precisely orchestrated to produce a product properly and to prevent unsafe conditions from occurring. Often, not only must the multiple components of a given machine work in concert, interactions between different machines must be coordinated as well. The components can include valves, motors, heaters, fans, and sensors, to name a few. To properly make a product pursuant to certain specifications set by an engineer, raw materials might undergo a multitude of processes as they transition into an intermediate product and finally a finished product. The processes might involve, for example, heating silicon in a crucible, extracting the silicon from the crucible at a specific rate and temperature to form a crystal, and partitioning the crystal into wafers. Other processes might include vapor deposition and etching of a wafer of silicon. In other industrial plants, similarly complex processes are carried out. Rather than relying on human operators to individually control each machine used in processes like those described above, a computerized control server which is communicatively coupled to the components of the various machines monitors the status of each machine and issues instructions to the machine components to generate a product from the raw materials.

The instructions issued by a control server to various components of machines originate from a program or "recipe" written by an engineer. Accordingly, in generating the program, the engineer must consider whether a set of instructions issued by the control server will cause an unsafe condition. Some machines include protective mechanisms which cause the machine to ignore an instruction that will cause damage to the machine. For example, if a machine receives an instruction to increase the temperature of a heating element beyond a temperature that would cause damage to surrounding components of the machine, or if an instruction would cause an overcurrent in an electrical component, the safety mechanism may disregard the instruction. However, such safety mechanisms do not have knowledge of other machines around them. Accordingly, these safety mechanisms are unable to assess whether an instruction issued to one machine, when combined with an instruction issued to another machine, would result in an unsafe condition, even if the instructions, considered independently, would not lead to an unsafe condition. For example, if a first machine is instructed to heat a heating element that is exposed to the environment and the second machine is instructed to release a combustible gas, an unsafe condition may result.

BRIEF DESCRIPTION OF THE INVENTION

In one aspect, a system for preventing an unsafe operation of at least one machine communicatively coupled to a computing device is provided. The system includes the computing device. The computing device includes a processor coupled to a memory. The memory contains processor-executable instructions that, when executed by the processor, cause the computing device to perform the steps of storing, in the memory, a first state of a first machine of the at least one machine and generating a first pending output to be issued to the first machine. The processor-executable instructions further cause the computing device to perform the steps of determining whether an unsafe condition would result if the first pending output is issued to the first machine in the first state, and issuing the first pending output upon determining that issuing the first pending output would not result in an unsafe condition and blocking the first pending output from being issued upon determining that issuing the first pending output would result in an unsafe condition.

In another aspect, a method for preventing an unsafe operation of at least one machine communicatively coupled to a computing device is provided. The computing device is coupled to a memory. The method is performed by the computing device and includes the steps of storing, in the memory, a first state of a first machine of the at least one machine and generating a first pending output to be issued to the first machine. The method further includes determining whether an unsafe condition would result if the first pending output is issued to the first machine in the first state, issuing the first pending output upon determining that issuing the first pending output would not result in an unsafe condition and blocking the first pending output from being issued upon determining that issuing the first pending output would result in an unsafe condition.

In another aspect, a computer-readable storage device having processor-executable instructions embodied thereon is provided. The processor-executable instructions are for preventing an unsafe operation of at least one machine communicatively coupled to a computing device. The computing device has a processor coupled to a memory. When executed by the processor, the processor-executable instructions cause the computing device to perform the steps of storing, in the memory, a first state of a first machine of the at least one machine and generating a first pending output to be issued to the first machine. The processor-executable instructions further cause the computing device to perform the steps of determining whether an unsafe condition would result if the first pending output is issued to the first machine in the first state, issuing the first pending output upon determining that issuing the first pending output would not result in an unsafe condition and blocking the first pending output from being issued upon determining that issuing the first pending output would result in an unsafe condition.

DETAILED DESCRIPTION OF THE INVENTION

Figure 1:
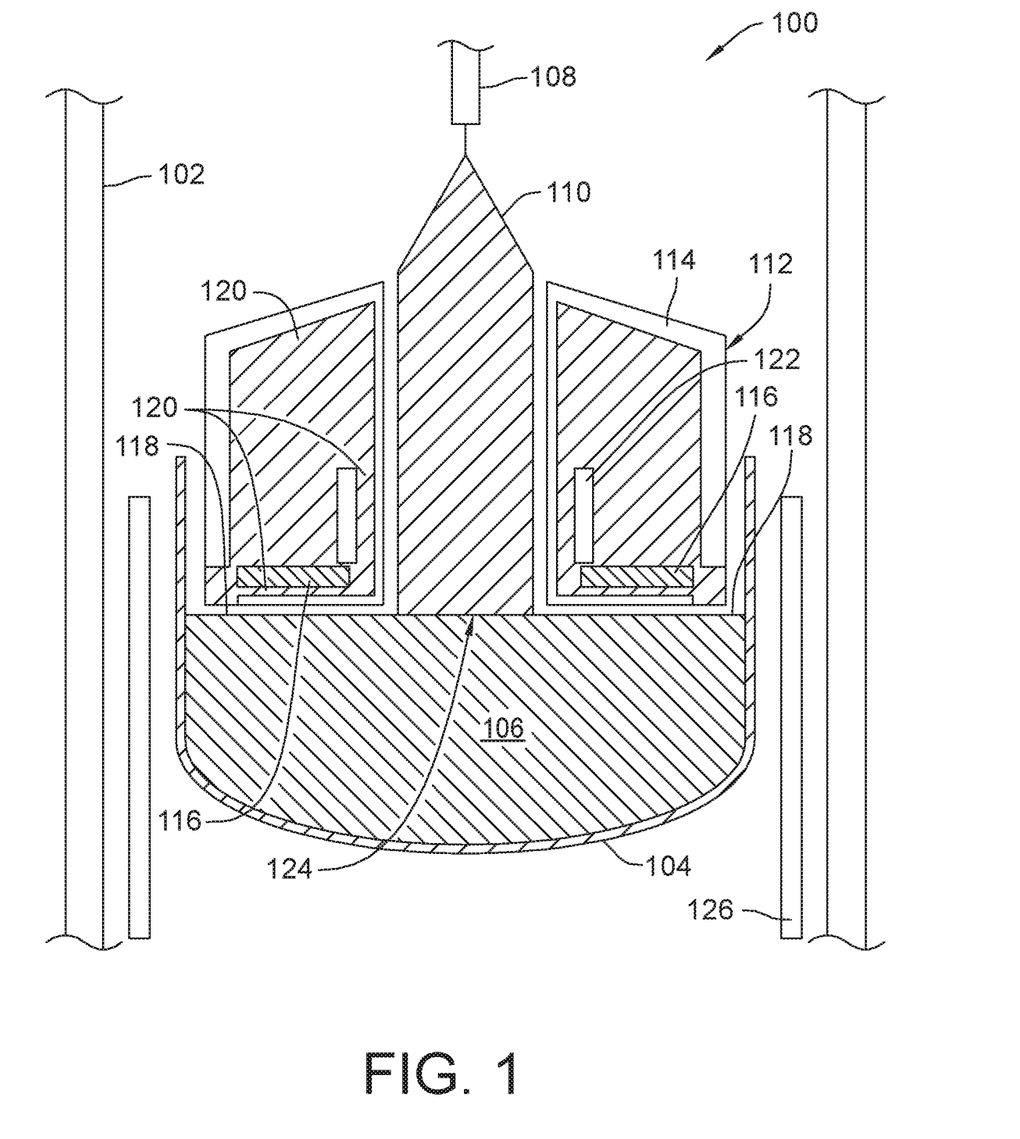
FIG. 1 is a diagram of a crystal puller, which may be controlled by a control server in accordance with an embodiment of the present invention.

FIG. 1 is a diagram of a crystal puller 100, which may be controlled by a control server in accordance with an embodiment of the present invention. Crystal puller 100 is used to grow monocrystalline ingots according to the Czochralski method. The Czochralski method is known to those skilled in the art of forming monocrystalline ingots. Crystal puller 100 includes a housing 102, and a quartz crucible 104 in the housing 102 for containing a semiconductor melt 106. The melt contains, for example, silicon. A pulling mechanism 108, such as a shaft or pull wire, secured in housing 102 and adapted to extend toward crucible 104, is adapted to continuously pull a solid monocrystalline ingot or crystal 110 from melt 106. A tubular graphite reflector 112 secured in a growth chamber of housing 102 includes a cover 114 preferably made of graphite and having a central opening sized and shaped for surrounding the growing crystal 110. An annular melt heat exchanger 116 is mounted within cover 114 to face the exposed melt surface 118.

Melt heat exchanger 116 includes a heat source such as an electrically-powered heater. Melt heat exchanger 116 may also include a heat absorption structure. Insulation 120 is disposed between melt heat exchanger 116 and melt surface 118 to inhibit heat transfer between melt surface 118 and melt heat exchanger 116. A crystal heat exchanger 122 is also mounted within cover 114 to surround and to face the growing crystal 110. Crystal heat exchanger 122 is disposed above melt heat exchanger 116 as close to the melt/crystal interface 124 as practical, such that crystal heat exchanger 122 cools a segment of crystal 110 proximate the interface 124. Crystal heat exchanger 122 is cooled by conventional cooling fluid, for example, water. Crystal heat exchanger 122 also includes a heater for controlling the temperature of the cooling fluid. Additionally, a side heater 126 is located adjacent crucible 104 for heating crucible 104. A control server in accordance with embodiments of the present invention may be used to set temperatures of melt heat exchanger 116, crystal heat exchanger 122, and side heater 126. Further, a control server in accordance with embodiments of the present invention may control the rate at which pull mechanism 108 pulls crystal 110 from melt 106.

Figure 2:
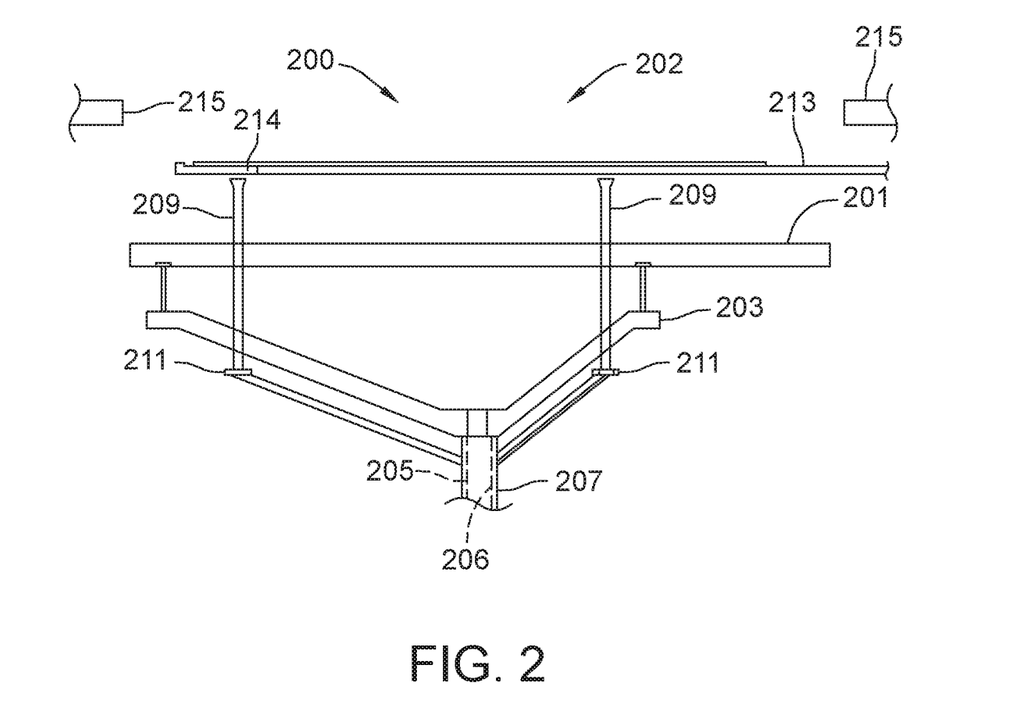
FIG. 2 is a diagram of components included in an epitaxial reactor, which may be controlled by a control server in accordance with an embodiment of the present invention.

FIG. 2 is a diagram of components included in an epitaxial reactor 200, which may be controlled by a control server in accordance with an embodiment of the present invention. A positioning mechanism 202 within the epitaxial reactor 200 operates to position a silicon wafer during various phases of a chemical vapor deposition processes within a chamber of the epitaxial reactor 200. The wafer may be supported by a susceptor 201. Susceptor 201 is mounted on arms 203, which, in turn, are mounted to a susceptor support shaft 205. Susceptor support shaft 205 is slidingly mounted within a bore 206 of a wafer lift shaft 207. A pneumatic mechanism (not shown) is operable to raise and lower susceptor support shaft 205 and wafer lift shaft 207 to various positions. The pneumatic mechanism (not shown) may also rotate susceptor 201. Rigid pins 209 are slidingly mounted to susceptor 201 and, when not elevated by susceptor 201, are supported by stops 211 of wafer lift shaft 207. Rigid pins 209 may support the wafer when brought into contact with the wafer.

During an exchange phase, a blade 213 carries the wafer into position above pins 209. Subsequently, wafer lift shaft 207 elevates, causing pins 209 to translate upwards and support the wafer. Blade 213 includes a notch 214 to allow room for one of pins 209 that would otherwise collide with blade 213. Once the wafer is supported by pins 209, blade 213 is withdrawn from the reactor 200. Next, susceptor support shaft 205 elevates, causing susceptor 201 to move upwards and come into contact with the wafer. Thereafter, the wafer is supported by susceptor 201. Susceptor support shaft 205 continues to elevate until susceptor 201 and the wafer are level with ring 215. At this point, the wafer and susceptor 201 are in the "process" position. When in the process position, susceptor 201 rotates as heat lamps (not shown) within epitaxial reactor 200 heat the wafer. Additionally, valves (not shown) are opened and closed to release various gases at precise temperatures, pressures, and times. For example, the wafer may undergo a pretreatment process during which a silicon oxide layer is removed from the surface of the wafer.

During the pretreatment process, the epitaxial reactor 200 heats the wafer, using heat lamps (not shown) to 1150 to 1220° C. The heat lamps are controlled to raise the temperature at 3 to about 18° C. per second. Then the chamber of the epitaxial reactor 200 is filled with $H_2$ and the wafer is annealed for 10 to 15 seconds. Next, an epitaxial layer is deposited on the wafer. The chamber of the epitaxial reactor 200 is filled a carrier gas, such as $H_2$, and a silicon-containing gas, for example, $SiHCL_3$, at atmospheric pressure. The wafer surface is maintained at a temperature of at least 900° C. during this process. After a predetermined time, the silicon-containing gas is purged with, for example, $H_2$. The wafer is then heated further, for a predetermined duration, for example 10 seconds. Next the wafer is cooled at a rate of 50° C. per second until it reaches 800° C. During this cooling process, susceptor 201 is lowered such that the wafer is supported only by pins 209. As is apparent, the above-described processes require a plurality of components of epitaxial reactor 200 to be precisely coordinated in order for the process to be carried out correctly.

Figure 3:
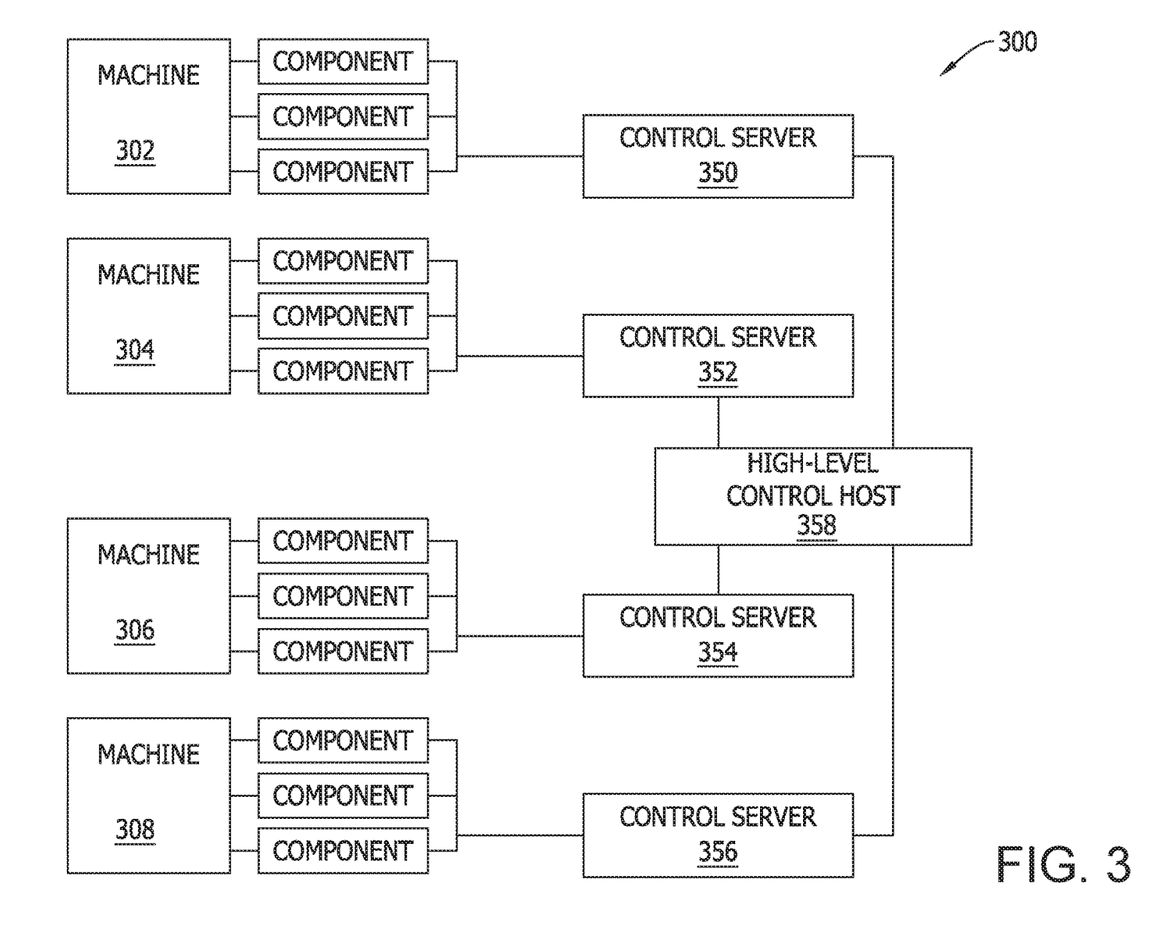
FIG. 3 is a block diagram of a plurality of machines having a plurality of components communicatively coupled to a plurality of control servers in accordance with an exemplary embodiment of the present invention.

FIG. 3 is a block diagram 300 of a plurality of machines including a first machine 302, a second machine 304, a third machine 306, and a fourth machine 308 having a plurality of components including a first component 310, a second component 312, a third component 314, a fourth component 316, a fifth component 318, a sixth component 320, a seventh component 322, an eighth component 324, a ninth component 326, a tenth component 328, and eleventh component 330, and a twelfth component 332 communicatively coupled to a plurality of control servers including a first control server 350, a second control server 352, a third control server 354, and a fourth control server 356 in accordance with an exemplary embodiment of the present invention. Machine 302, is for example, a crystal puller and machines 304, 306, and 308 are, for example, epitaxial reactors. In the exemplary embodiment, machines 302, 304, 306, and 308 are used in the generation of silicon wafers in a silicon wafer manufacturing plant. However, those skilled in the art will appreciate that the methods and systems disclosed herein are equally applicable to other processes and other environments, and that the number of machines may vary.

Communicatively coupled to machine 302, which is a crystal puller, are components 310, 312, and 314. Component 310 is a pulling mechanism similar to pulling mechanism 108 (FIG. 1), component 312 is a melt heat exchanger, similar to melt heat exchanger 116 (FIG. 1), and component 314 is a crystal heat exchanger, similar to crystal heat exchanger 122 (FIG. 1). Machines 304, 306, and 308 are epitaxial reactors, similar to epitaxial reactor 200 (FIG. 2). Components 316, 322, and 328 are susceptor support shafts, similar to susceptor support shaft 205 (FIG. 2). Components 318, 324, and 330 are wafer lift shafts, similar to wafer lift shaft 207 (FIG. 2). Components 320, 326, and 332 are gas valves, similar to those discussed with reference to epitaxial reactor 200 (FIG. 2). FIG. 3 is a simplified representation of machines and associated components, and, as is evident from the discussion of crystal puller 100 and epitaxial reactor 200, additional components, including pneumatic mechanisms, heaters, temperature sensors, and pressure sensors are also included as components of one or more of the machines.

A first control server 350 is communicatively coupled to components 310, 312, and 314 of machine 302. A second control server 352 is communicatively coupled to components 316, 318, and 320 of machine 304. A third control server 354 is communicatively coupled to components 322, 324, and 326 of machine 306. A fourth control server 356 is communicatively coupled to components 328, 330, and 332 of machine 308. A high level control host 358 which monitors and issues high-level instructions to each of control servers 350, 352, 354, and 356. Control server 350 issues instructions to and receives information from components 310, 312, and 314. For example, control server 350 may instruct component 312, which is a melt heat exchanger, to reach a target temperature. Another component, which is a temperature sensor, provides temperature information to control server 350. Control server 350 also instructs crystal heat exchanger, which is component 314, to reach a target temperature. Another component, which is a temperature sensor for the crystal heat exchanger, provides temperature information to control server 350. Once the target temperature of the melt heat exchanger (component 312) and crystal heat exchanger (component 314) reach their target temperatures, control server 350 instructs puller mechanism to lower a crystal into the melt and begin pulling the crystal out of the melt at a particular rate. Control servers 352, 354, and 356 may simultaneously be issuing instructions and receiving sensor information from epitaxial reactors (machines 304, 306, and 308) to carry out loading of silicon wafers, removal of silicon oxide from the silicon wafers, epitaxial deposition onto the silicon wafers, heating and cooling of the silicon wafers, and/or unloading of the silicon wafers. High level control host 358 may monitor the status of each of control servers 350, 352, 354, and 356, issue high-level commands such as shutting down or starting up any of control servers 350, 352, 354, and 356 and logging any errors.

Figure 4:
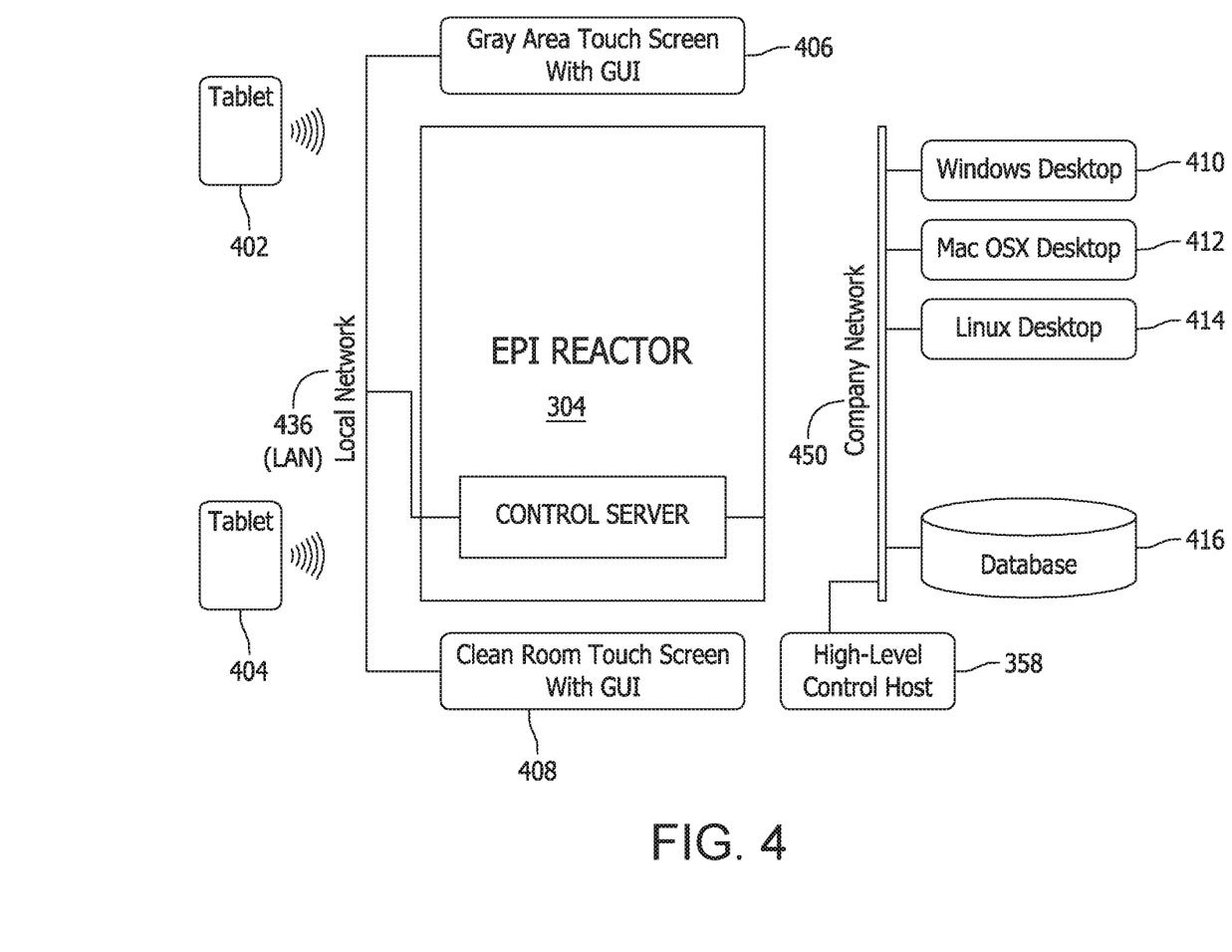
FIG. 4 is a block diagram of a system for controlling components of a machine, in accordance with an embodiment of the present invention.

FIG. 4 is a block diagram of a system 400 for controlling components of a machine, in accordance with an embodiment of the present invention. Components in system 400, identical to components of system 300 (shown in FIG. 3), are identified in FIG. 4 using the same reference numerals used in FIG. 4. System 400 includes control server 352 and machine 304, which is an epitaxial reactor. A disk storage unit containing database 416 company network 450, which may be, for example, a wide area network (WAN). In some embodiments, company network 450 may be accessible through an Internet connection. System also includes a local area network (LAN) 436. Client devices 402 and 404, which are both tablet computing devices, are communicatively coupled to LAN 436 through wireless network connections. Client devices 406 and 408 are physically coupled to LAN 436 through wired connections. Also coupled to LAN 436 is control server 352. Control 352 is communicatively coupled to machine 304, which is an epitaxial reactor, as explained above. Each of client devices 402, 404, 406, and 408 is configured to interact with control server 352 using a user interface, such as a graphical user interface (GUI). Client devices 410, 412, and 414 are also communicatively coupled to control server 352 through company network 450. Client device 410 may be executing a Windows operating system. Client device 412 may be operating, for example, an OS X operating system. Moreover, client device 414 may be operating, for example, a Linux operating system. That is, each of client devices 410, 412, and 414 are able to communicate with control server 352 regardless of the operating system running on the client device. Client devices 402, 404, 406, 408, 410, 412, and 414 may issue instructions to control server 352, such as information regarding processes and steps in the processes ("recipes") for producing products using machine 304 and for receiving status information regarding machine 304 and the components thereof. Database 416 is coupled to company network 450 and may store settings, logs, and other data to enable system 400 to operate as described herein.

In some embodiments, rather than communicating directly with control server 352, one or more of client devices 402, 404, 406, 408, 410, 412, and 416 may communicate with high-level control host 358 (FIG. 3). By communicating with high-level control host 358, rather than directly communicating with control server 352, instructions may be submitted to another control server, for example 350, 354, or 356, depending on the current capacity of each of control servers 350, 352, 354, and 356, as determined by high-level control host 358.

Figure 5:
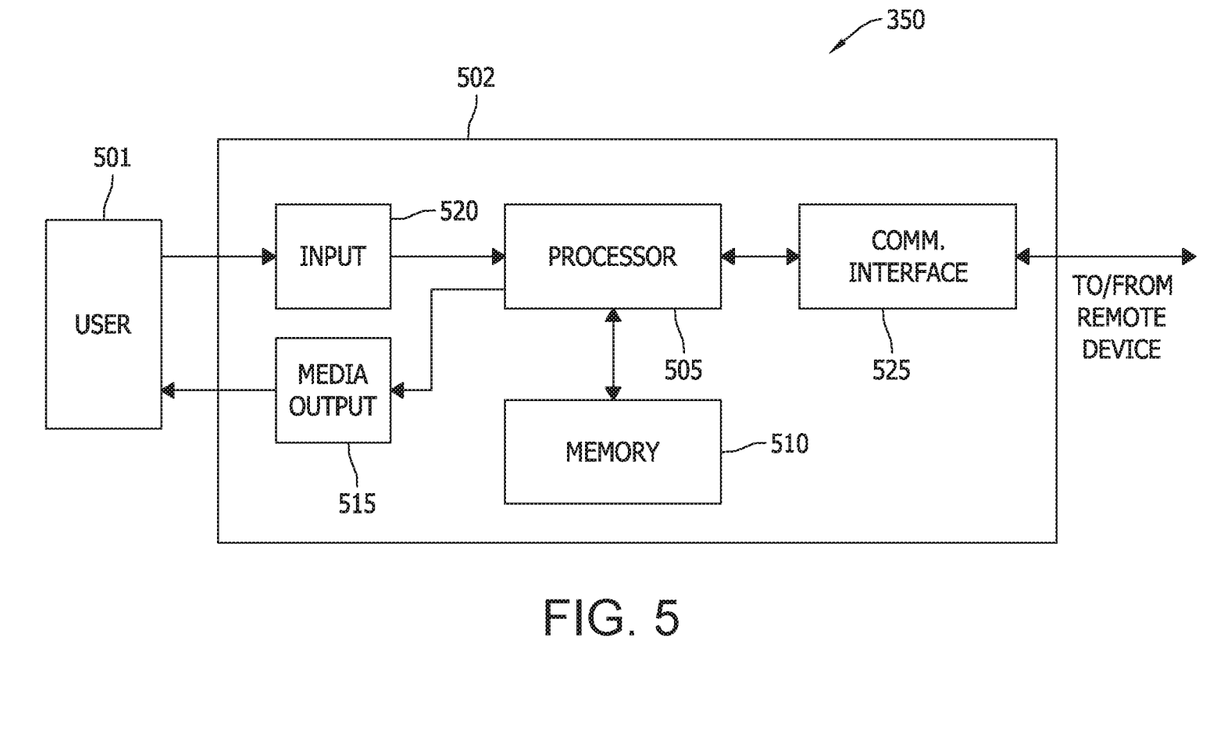
FIG. 5 illustrates a configuration of a computing device in accordance with an exemplary embodiment of the present invention.

FIG. 5 illustrates a configuration of a computing device 502 in accordance with an exemplary embodiment of the present invention. For example, computing device 502 is representative of any of control servers 350, 352, 354, 356, high-level control host 358, and of any of client devices 402, 404, 406, 408, 410, 412, and 414. Computing device 502 includes a processor 505 for executing instructions. In some embodiments, executable instructions are stored in a memory area 510. Processor 505 may include one or more processing units (e.g., in a multi-core configuration). Memory area 510 is any device allowing information such as executable instructions and/or data to be stored and retrieved. Memory area 510 may include one or more computer readable storage device or other computer readable media, including transitory and non-transitory computer readable media.

Computing device 502 also includes at least one media output component 515 for presenting information to user 501. Media output component 515 is any component capable of conveying information to user 501. In some embodiments, media output component 515 includes an output adapter such as a video adapter and/or an audio adapter. An output adapter is operatively coupled to processor 505 and operatively couplable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, at least one such display device and/or audio device is included in media output component 515.

In some embodiments, computing device 502 includes an input device 520 for receiving input from user 501. Input device 520 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of media output component 515 and input device 520.

Computing device 502 may also include a communication interface 525, which is communicatively couplable to a remote computing device such as any of control servers 350, 352, 354, 356, high-level control host 358, and client devices 402, 404, 406, 408, 410, 412, and 414. Communication interface 525 of control servers 350, 352, 354, and 356 are additionally coupled to components of machines 302, 304, 306, and 308 as described above. Communication interface 525 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in memory area 510 are, for example, processor-executable instructions for providing a user interface to user 501 via media output component 515 and, optionally, receiving and processing input from input device 520. A user interface may include, among other possibilities, a web browser and client application. Web browsers enable users, such as user 501, to display and interact with media and other information typically embedded on a web page or a website from a server system. A client application allows a user, such as user 501, to display and interact with a server system, such as control server 352, in a manner that does not necessarily involve a web page or website and which may offload more storage and/or processing functions to the client application from the server system.

Memory area 510 may include, but is not limited to, any computer-operated hardware suitable for storing and/or retrieving processor-executable instructions and/or data. Memory area 510 may include random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Further, memory area 510 may include multiple storage units such as hard disks or solid state disks in a redundant array of inexpensive disks (RAID) configuration. Memory area 510 may include a storage area network (SAN) and/or a network attached storage (NAS) system. In some embodiments, memory area 510 includes memory that is integrated in computing device 502. For example, computing device 502 may include one or more hard disk drives as memory 510. Memory area 510 may also include memory that is external to computing device 502 and may be accessed by a plurality of computing devices 502. The above memory types are exemplary only, and are thus not limiting as to the types of memory usable for storage of processor-executable instructions and/or data.

Control server 350 contains, within memory area 510, processor-executable instructions for executing multiple threads for controlling components of machine 302. Each thread may cause control server 350 to issue instructions to machine 302 for a series of steps (again, a "recipe") for generating a product. The threads executing in control server 350 interact with the components of machine 302 through control objects, embodied in processor-executable instructions in the memory area 510 of control server 350. The control objects are configured and managed in a particular manner that prevents multiple threads from simultaneously accessing and issuing conflicting instructions to a component of a machine 302 and/or causing race conditions or deadlocks, as known in the art of multithreaded processing. The same is true of control servers 352, 354, and 356 and respective machines 304, 306, and 308.

Figure 6:
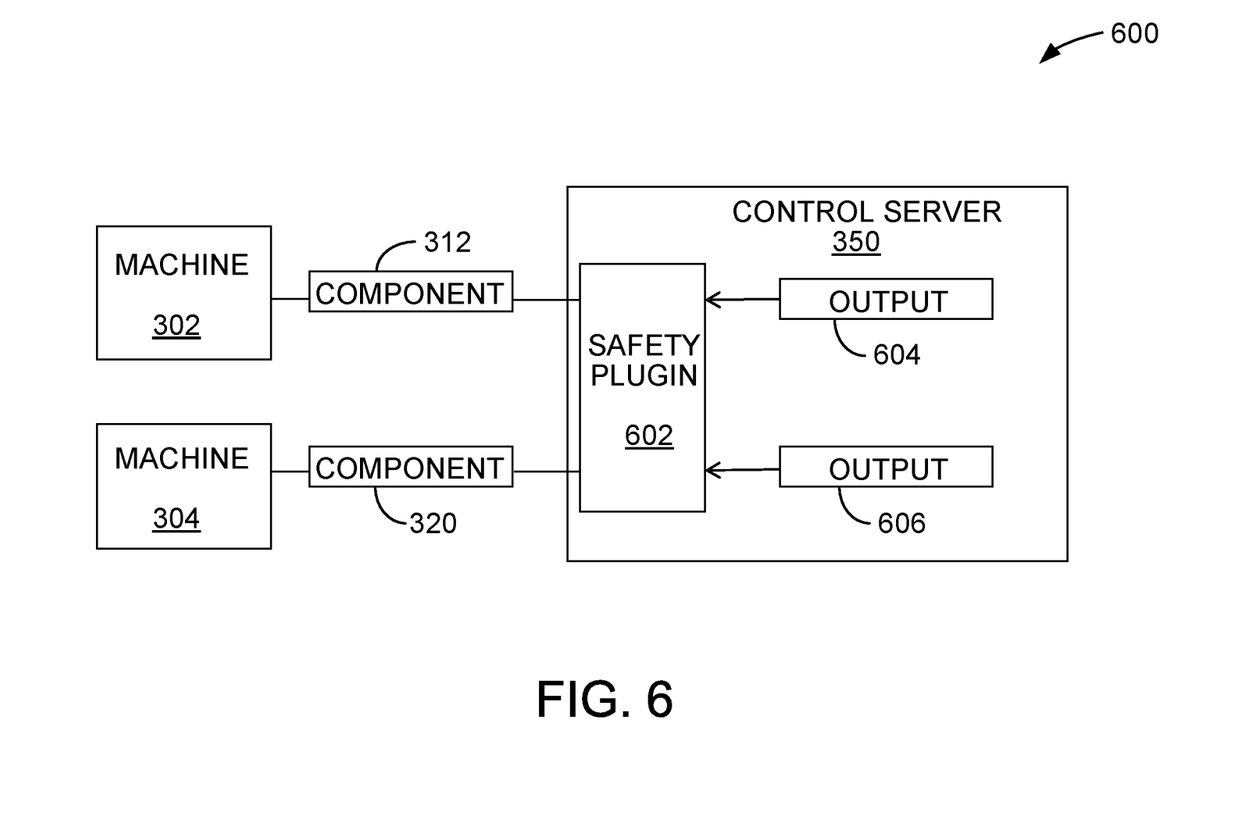
FIG. 6 is a block diagram showing a safety plugin relative to pending outputs from the control server and components of one or more machines, in accordance with an exemplary embodiment of the present invention.

FIG. 6 is a block diagram 600 showing the safety plugin 602 relative to a first pending output 604 and a second pending output 606 from control server 350. Safety plugin 602 intercepts all pending outputs, for example first pending output 604 and second pending output 606, and evaluates whether any one or combination of pending outputs 604 and 606 would cause an unsafe condition if issued to components 310 and 316 of machines 302 and 304. That is, a master thread of safety plugin 602 stores information about the state of each machine 302 and 304, receives pending outputs 604 and 606, that would otherwise be issued directly to one or more components 312 and 320 of machines 302 and 304, compares pending outputs 604 and 606 against the current state of each machine 302 and 304, determines whether one or more of the pending outputs 604 and 606 would place one or more of machines 302 and 304 into a state that causes an unsafe condition, and determines whether to allow pending outputs 604 and 606 to be issued to one or more of machines 302 and 304 or block one or more of pending outputs 604 and 606 from being issued to one or more of machines 302 and 304. These steps are explained in more detail below.

Figure 7:
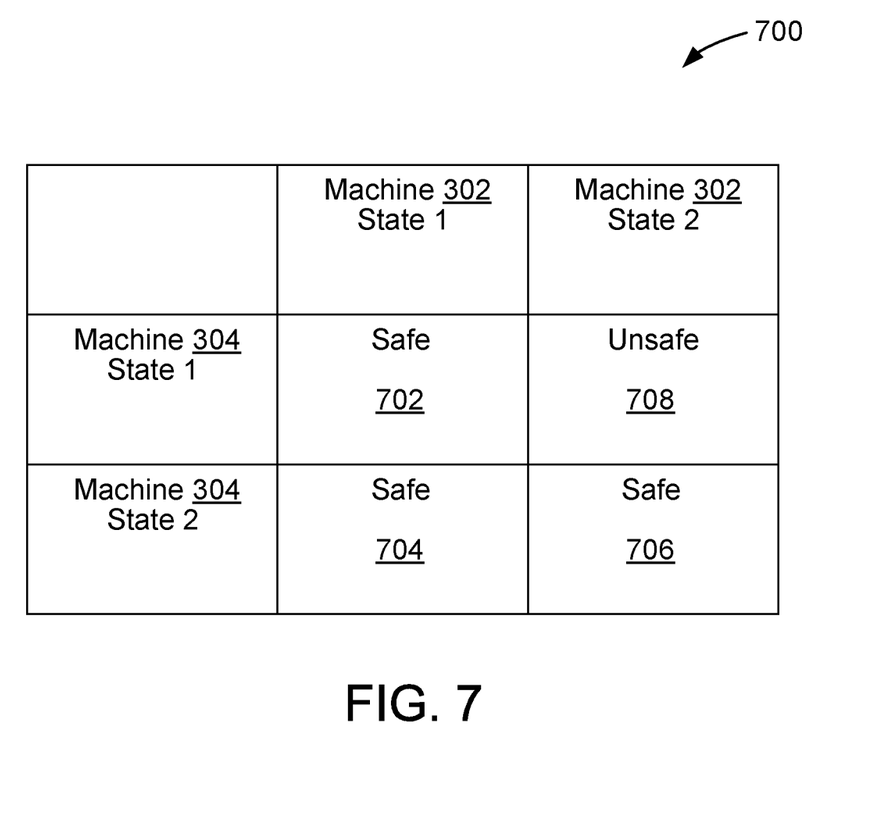
FIG. 7 is a lookup table of machine states and corresponding safe and unsafe conditions stored in memory area of a control server in accordance with an exemplary embodiment of the present invention.

FIG. 7 is a lookup table 700 of machine states and corresponding safe and unsafe conditions stored in memory area 510 of control server 350 in accordance with an exemplary embodiment of the present invention. A master thread of safety plugin 602 (FIG. 6) references lookup table in determining whether one or more pending outputs (e.g., first pending output 604 and second pending output 606) would result in an unsafe condition or state. In some embodiments, lookup table 700 may be generated by a programmer or other person with knowledge of the machines and potential unsafe conditions resulting from different combinations of operations performed by the machines. In other embodiments, safety plugin 602 populates lookup table 700 using physics-based models of the machines to determine how they would react in varying combinations of states. In yet other embodiments, safety plugin uses such physics-based models to determine whether an unsafe condition would result upon receiving pending outputs, rather than pre-populating a lookup table and referencing it upon receiving pending outputs.

As indicated in lookup table 700, machine 302, which is a crystal puller, and machine 304, which is an epitaxial reactor, result in an unsafe condition 708 when machine 302 is in state 2 and machine 304 is in state 1. That is, for machine 302, state 1 is that component 312, which is a melt heat exchanger, is not above a threshold temperature. State 2 of machine 302 is that component 312, again a melt heat exchanger, is above a threshold temperature. For machine 304, which is an epitaxial reactor, state 1 is that component 320, which is a gas valve, is releasing a combustible gas, such as $H_2$ gas, while the epitaxial reactor is unsealed. State 2 is that component 320 is not releasing the combustible gas. The combination of the combustible gas potentially reaching the melt heat exchanger while the melt heat exchanger is above a threshold temperature may result in an unsafe condition. Accordingly, this combination 708 of states is indicated as unsafe in lookup table 700. Combinations 702, 704, and 706, on the other hand, are safe. Of course, the scenario described in association with lookup table 700 is simplified, for illustrative purposes, and excludes the possibility of other heat sources in the vicinity. In addition, other combinations of states may additionally or instead be considered safe or unsafe. For example, whether a combination of states would cause a product to be manufactured incorrectly, even if no harm would result to people or machines in the vicinity, may determine whether the combination of states is categorized as safe or unsafe.

Figure 8:
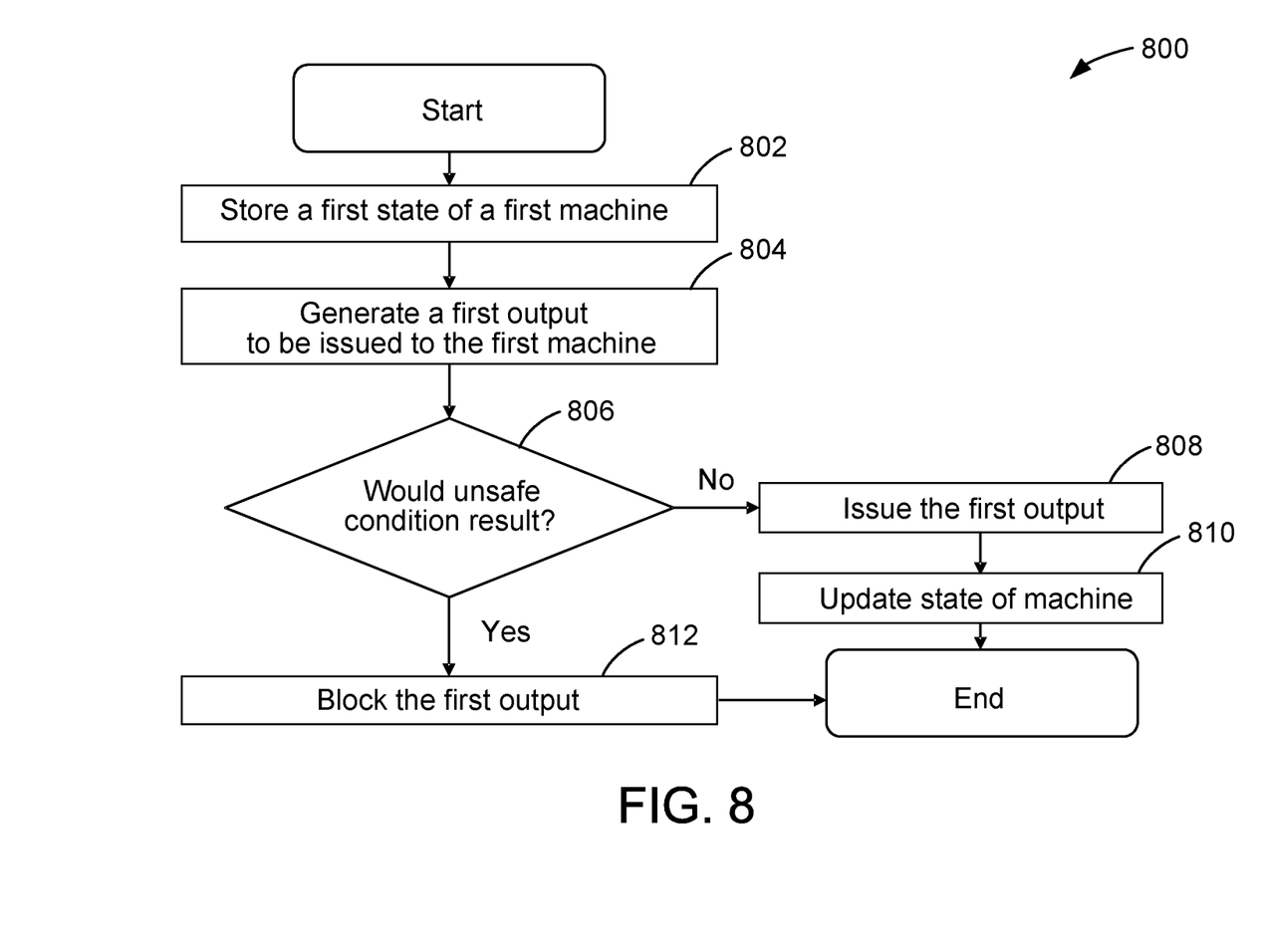
FIG. 8 is a flowchart of a method that may be implemented by the system of FIG. 4 for preventing unsafe operations in accordance with an exemplary embodiment of the present invention.

FIG. 8 is a flowchart 800 of a method for preventing unsafe operations in accordance with an exemplary embodiment of the present invention. At step 802, control server 350, and more specifically safety plugin 602, stores, in memory area 510, a first state of a first machine, for example machine 302. At step 804, a thread executing within control server 350 for controlling one or more components of a machine generates a first pending output, for example pending output 604 (FIG. 6). At step 806, control server 350, and more specifically safety plugin 602, determines whether allowing the component to which the pending output is directed, for example component 312 of machine 302, to receive the pending output and perform the corresponding operation would cause a resulting unsafe combination of states. That is, by performing the operation associated with the pending output, machine 302 would transfer from a first state to a second state.

If control server 350, through safety plugin 602 referencing lookup table 700, determines that the resulting state, taken in combination with states of other machines, would not result in an unsafe condition, control server 350 proceeds to step 808. At step 808, control server 350, through safety plugin 602, issues or writes 604 the pending output to the hardware (e.g., a component of a machine). In this example, the pending output is issued or written to component 312. At step 810, control server 350, through safety plugin 602, updates memory area 510 to indicate that machine 302 is now in state 2. If, at step 806, control server 350, through safety plugin 602, determines that pending output 604, if performed by component 312, would cause an unsafe condition, control server 350 proceeds to step 812, whereupon control server 350 blocks or prevents the pending output 604 from being issued or written to component 312.

The process described above is performed in a loop by control server 350. That is, certain threads executing in control server 350 generate pending outputs, for example at least a first pending output (e.g., first pending output 604) and a second pending output (e.g., second pending output 606), to be issued or written to machine components and a master thread executing in control server 350 receives the pending outputs, evaluates their safety, and issues (writes) the pending outputs to the hardware, or blocks one or more of the pending outputs, as described above.

As referenced above, in some embodiments, multiple pending outputs (e.g., at least a first pending output and a second pending output) are generated in an iteration of the loop. In such instances, control server 350 evaluates the safety of the combination of states that would result from the multiple pending outputs being issued, before blocking or issuing one or more of the multiple pending outputs. Further, in some embodiments, blocking one or more pending outputs includes blocking the one or more pending outputs for a predetermined length of time, then issuing the one or more pending outputs after the predetermined length of time has elapsed, so as to avoid a combination of machine states that would lead to an unsafe condition. In other embodiments, rather than waiting for a predetermined length of time to issue the one or more blocked pending outputs, control server 350 issues the blocked pending outputs in a later iteration of the loop. Further, in some embodiments, if one or more pending outputs are blocked, control server 350 stores an error indicator in memory area 510, for example for logging and/or diagnostic purposes.

Figure 9:
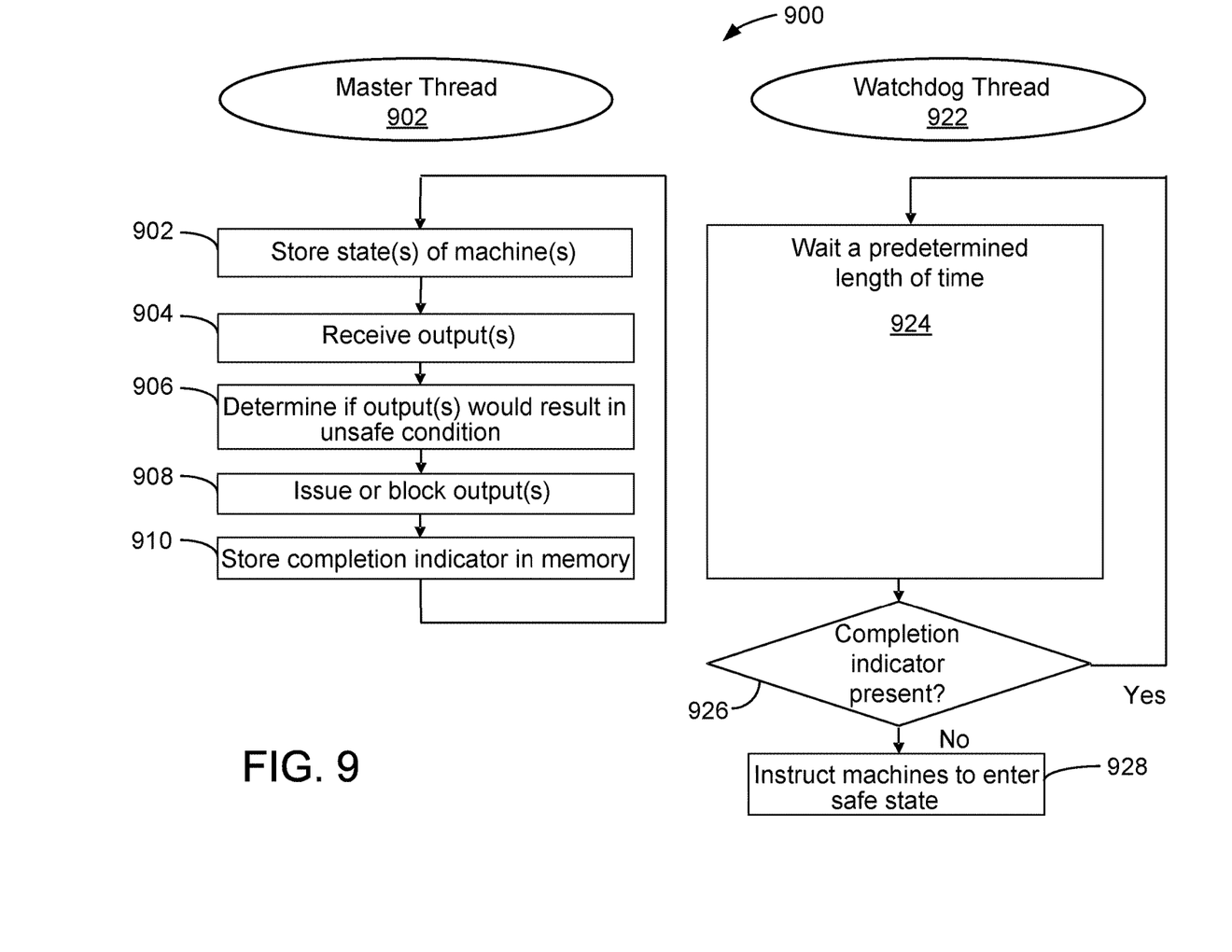
FIG. 9 is a flowchart of processes carried out by two threads executing in a control server in accordance with an exemplary embodiment of the present invention.

FIG. 9 is a flowchart of processes carried out by two threads executing in control server 350. More specifically, master thread 902 carries out steps 902, 904, 906 and 908 while a watchdog thread 922 concurrently carries out steps 924, 926, and 928. In step 902, master thread 902 stores or maintains in memory area 510 the current states of machine controlled by control server 350. At step 904, master thread 902 receives one or more pending outputs generated by one or more other threads executing in control server 350. At step 906, master thread 902 determines if the received pending outputs, if issued, would result in an unsafe condition, as described above with reference to FIGS. 7 and 8. At step 908, master thread 902 issues or blocks one or more of the pending outputs, in accordance with the process described with reference to FIG. 8. At step 910, master thread 902 stores a completion indicator in memory area 510. The completion indicator is a Boolean value, a number, a string, or any other data that indicates that master thread 902 has completed steps 902-908. Next, master thread 902 loops back to step 902. In the exemplary embodiment, and given that steps 902-908 are performed in a loop, the completion indicator includes an iteration identifier to identify the particular iteration of the loop that was successfully completed.

In the exemplary embodiment, master thread 902 stores the completion indicator in memory area 510 regardless of whether all of the pending outputs were issued to the corresponding machines. That is, in the exemplary embodiment, the completion indicator is not an indication that master thread 902 determined that all pending outputs from a particular iteration were safe, but rather that master thread 902 completed the steps of storing the current state of the machines controlled by control server 350, receiving the pending outputs, determining if the pending outputs would result in an unsafe condition, and issuing or blocking one or more of the pending outputs.

As mentioned above, watchdog thread 922 executes concurrently with master thread 902. Watchdog thread 922 waits a predetermined length of time for master thread to perform steps 902, 904, 906, 908, and 910 discussed above. Upon expiration of the predetermined length of time, master thread 924 proceeds to step 926 where it determines whether master thread 902 has stored a completion indicator in memory area 510. If the completion indicator is present, watchdog thread 922 proceeds back to step 924 and waits for master thread 902 to complete another iteration of steps 902-910. If, however, the completion indicator is not present in memory area 510, then watchdog thread 922 instructs the one or more machines controlled by control server 350 to enter into a safe state and blocks further pending outputs from being issued to the one or more machines. In the exemplary embodiment, the safe state of the machines is a shutdown or powered-down state. In other embodiments, the safe states are other than shutdown or powered-down states and the machines are preconfigured or preprogrammed to enter into the safe states upon receiving a corresponding instruction from control server 350.

In some embodiments, watchdog thread 922, upon determining the completion indicator is present in memory area 510, deletes the completion indicator from memory area 510. Accordingly, when master thread 902 completes another iteration of steps 902-910, the completion indicator once again is present in memory area 510. In other embodiments, watchdog thread 922 does not delete the completion indicator from memory area 510. In such embodiments, a completion indicator for multiple, and in some embodiments, every iteration, of steps 902-910 are stored in memory area 510. In these embodiments, each completion indicator includes or is associated with an iteration identifier identifying the iteration of steps 902-910 that was successfully completed. Storing a completion indicator for every iteration of steps 902-910 and maintaining it in memory area 510, rather than deleting and replacing it for every iteration, may be advantageous for maintaining a log of operations and/or for performing diagnostics in the event of a malfunction.

A technical effect of systems and methods described herein includes at least one of: (a) storing, in a memory coupled to a computer, a first state of a first machine; (b) generating a first pending output to be issued to the first machine; (c) determining whether an unsafe condition would result if the first pending output is issued to the first machine in the first state; and (d) issuing the first pending output upon determining that issuing the first pending output would not result in an unsafe condition and blocking the first pending output from being issued upon determining that issuing the first pending output would result in an unsafe condition.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for preventing an unsafe operation of at least one machine communicatively coupled to a computing device that is coupled to a memory, the method is performed by the computing device and comprises the steps of:
    storing, in the memory, a first state of a first machine of the at least one machine;
    generating a first pending output to be issued to the first machine;
    determining whether an unsafe condition would result if the first pending output is issued to the first machine in the first state;
    issuing the first pending output upon determining that issuing the first pending output would not result in an unsafe condition;
    blocking the first pending output from being issued upon determining that issuing the first pending output would result in an unsafe condition;
    storing, in the memory, a second state of a second machine of the at least one machine;
    generating a second pending output to be issued to the second machine;
    determining whether an unsafe condition would result if the first pending output is issued to the first machine in the first state and the second pending output is issued to the second machine in the second state;
    issuing the first pending output and second pending output upon determining that issuing the first pending output and second pending output would not result in an unsafe condition or blocking at least one of the first pending output and second pending output from being issued upon determining that issuing the first pending output and second pending output would result in an unsafe condition.

2. The method of claim 1, wherein blocking at least one of the first pending output and second pending output from being issued further includes blocking at least one of the first pending output and the second pending output for a predetermined period of time, then issuing the blocked at least one of the first pending output and the second pending output.

3. The method of claim 1, further comprising storing an error indicator in the memory upon determining that issuing the first pending output would result in an unsafe condition.

4. The method of claim 1, further comprising the step of executing a master thread and performing the steps in the master thread.

5. The method of claim 1, further comprising the step of storing a completion indicator in the memory.

6. The method of claim 5, further comprising the steps of:
    executing a watchdog thread;
    with the watchdog thread, determining whether the completion indicator is stored in the memory after a predetermined period of time has elapsed; and
    with the watchdog thread, instructing the at least one machine to enter a safe state upon determining that the completion indicator is not stored in the memory after the predetermined period of time has elapsed.

7. The method of claim 5, further comprising the steps of:
    executing a watchdog thread;
    with the watchdog thread, determining whether the completion indicator is stored in the memory after a predetermined period of time has elapsed; and
    with the watchdog thread, instructing the at least one machine to enter a safe state upon determining that the completion indicator is not stored in the memory after the predetermined period of time has elapsed and blocking further instructions from being issued to the at least one machine.

8. A system for preventing an unsafe operation of a plurality of semiconductor wafer manufacturing machines communicatively coupled to a computing device, the system comprising said computing device, said computing device including a processor coupled to a memory, said memory containing processor-executable instructions that, when executed by said processor, cause said computing device to perform the steps of:

storing, in said memory, a first state of a first machine of the plurality of machines;
generating a first pending output to be issued to the first machine;
determining whether an unsafe condition would result if the first pending output is issued to the first machine in the first state;
issuing the first pending output upon determining that issuing the first pending output would not result in an unsafe condition;
blocking the first pending output from being issued upon determining that issuing the first pending output would result in an unsafe condition;
storing, in said memory, a second state of a second machine of the plurality of machines;
generating a second pending output to be issued to the second machine;
determining whether an unsafe condition would result if the first pending output is issued to the first machine in the first state and the second pending output is issued to the second machine in the second state; and
issuing the first pending output and second pending output upon determining that issuing the first pending output and second pending output would not result in an unsafe condition or blocking at least one of the first pending output and second pending output from being issued upon determining that issuing the first pending output and second pending output would result in an unsafe condition.

9. The system of claim 8, wherein said memory further includes processor-executable instructions such that blocking at least one of the first pending output and second pending output from being issued further includes blocking at least one of the first pending output and the second pending output for a predetermined period of time, then issuing the blocked at least one of the first pending output and the second pending output.

10. The system of claim 8, wherein the processor-executable instructions further cause said computing device to perform the step of storing an error indicator in said memory upon determining that issuing the first pending output would result in an unsafe condition.

11. The system of claim 8, wherein the processor-executable instructions further cause said computing device to execute a master thread and perform the steps in the master thread.

12. The system of claim 8, wherein the processor-executable instructions further cause said computing device to perform the step of storing a completion indicator in said memory.

13. The system of claim 12, wherein the processor-executable instructions further cause said computing device to perform the steps of:
executing a watchdog thread;
with the watchdog thread, determining whether the completion indicator is stored in said memory after a predetermined period of time has elapsed; and
with the watchdog thread, instructing the at least one machine to enter a safe state upon determining that the completion indicator is not stored in said memory after the predetermined period of time has elapsed.

14. The system of claim 12, wherein the processor-executable instructions further cause said computing device to perform the steps of:

executing a watchdog thread;
with the watchdog thread, determining whether the completion indicator is stored in said memory after a predetermined period of time has elapsed; and
with the watchdog thread, instructing at least one machine of the plurality of machines to enter a safe state upon determining that the completion indicator is not stored in said memory after the predetermined period of time has elapsed and blocking further pending outputs from being issued to the at least one machine.

15. A non-transitory computer-readable storage device having processor-executable instructions embodied thereon for preventing an unsafe operation of at least one machine communicatively coupled to a computing device, the computing device having a processor coupled to a memory, wherein, when executed by said processor, the processor-executable instructions cause the computing device to perform the steps of:
storing, in the memory, a first state of a first machine of the at least one machine;
generating a first pending output to be issued to the first machine;
determining whether an unsafe condition would result if the first pending output is issued to the first machine in the first state;
issuing the first pending output upon determining that issuing the first pending output would not result in an unsafe condition;
blocking the first pending output from being issued upon determining that issuing the first pending output would result in an unsafe condition;
storing, in the memory, a second state of a second machine of the at least one machine;
generating a second pending output to be issued to the second machine;
determining whether an unsafe condition would result if the first pending output is issued to the first machine in the first state and the second pending output is issued to the second machine in the second state; and
issuing the first pending output and second pending output upon determining that issuing the first pending output and second pending output would not result in an unsafe condition or blocking at least one of the first pending output and second pending output from being issued upon determining that issuing the first pending output and second pending output would result in an unsafe condition.

16. The computer-readable storage device of claim 15, wherein the memory further includes processor-executable instructions such that blocking at least one of the first pending output and second pending output from being issued further includes blocking at least one of the first pending output and the second pending output for a predetermined period of time, then issuing the blocked at least one of the first pending output and the second pending output.

17. The computer-readable storage device of claim 15, wherein the processor-executable instructions further cause the computing device to perform the step of storing an error indicator in the memory upon determining that issuing the first pending output would result in an unsafe condition.

* * * * *